United States Patent

Hsu

[11] Patent Number: 5,989,955
[45] Date of Patent: Nov. 23, 1999

[54] METHOD OF FORMING STACKED AND TRENCH TYPE DRAM CAPACITOR

[75] Inventor: Chen-Chung Hsu, Taichung, Taiwan

[73] Assignee: United Microelectronics Corp., Taiwan

[21] Appl. No.: 09/063,486

[22] Filed: Apr. 21, 1998

Related U.S. Application Data

[62] Division of application No. 08/903,885, Jul. 31, 1997.

[30] Foreign Application Priority Data

May 6, 1997 [TW] Taiwan .................................. 86105969

[51] Int. Cl.$^6$ ............................................... H01L 21/8242
[52] U.S. Cl. ........................... 438/253; 438/254; 438/396; 438/397
[58] Field of Search ...................................... 438/239, 243, 438/244, 253, 254, 386, 387, 396, 397; 257/303, 306

[56] References Cited

U.S. PATENT DOCUMENTS

| | | | |
|---|---|---|---|
| 5,434,812 | 7/1995 | Tseng | 257/303 |
| 5,637,523 | 6/1997 | Fazan et al. | 438/397 |
| 5,688,709 | 11/1997 | Rostoker | 438/254 |
| 5,891,772 | 4/1999 | Hsu | 438/254 |
| 5,910,667 | 6/1999 | Hsu | 257/306 |

*Primary Examiner*—Charles Bowers
*Assistant Examiner*—Jack Chen
*Attorney, Agent, or Firm*—Rabin & Champagne, PC

[57] ABSTRACT

A DRAM capacitor structure and its manufacturing include covering a semiconductor substrate with a first conducting layer. A first insulating layer and a second insulating layer are alternately stacked at least once above the first conducting layer to form a multi-layered structure. A contact window opening is formed in the multi-layered structure to expose a source/drain region located above the semiconductor substrate. A pattern is etch-defined on the multi-layered structure, using the first insulating layer as an etching stop layer. Part of the second insulating layer is etched away to form a cross-sectional profile similar to twin towers, with each tower having the form of a vertical T-stack. A second conducting layer covers the multi-layered structure. The first insulating layer and the second insulating layer of the multi-layered structure, as well as the second conducting layer in a top part of the multi-layered structure, are etched away to form a lower electrode. A dielectric layer is formed above the lower electrode. An upper electrode is formed above the dielectric layer.

19 Claims, 10 Drawing Sheets

METHOD OF FORMING STACKED AND TRENCH TYPE DRAM CAPACITOR

This is a Division of Copending application Ser. No. 08/903,885, filed Jul. 31, 1997.

BACKGROUND OF THE INVENTION

1. Field of Invention

This invention relates in general to a structure and a method of manufacturing a dynamic random-access-memory (DRAM) capacitor. More particularly, this invention relates to a structure and a method of manufacturing a stacked-type capacitor, as well as an improved combination of a stacked- and trench-type capacitor.

2. Description of Related Art

Figure 1:
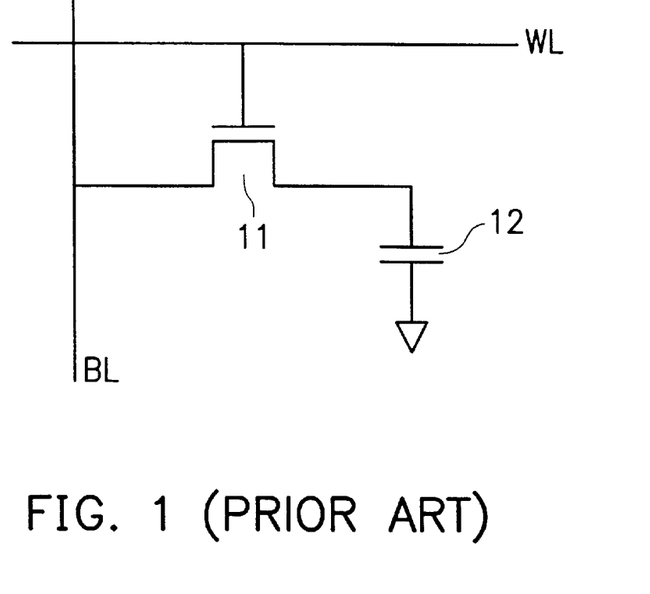
FIG. 1 is a circuit diagram of a conventional DRAM cell.

DRAM is a type of volatile memory having a signal which is stored in a digital state, depending on the charging state of the capacitor, in each memory cell. FIG. 1 is a circuit diagram of a conventional DRAM cell, which comprises a metal oxide semiconductor (MOS) transistor 11 having a gate connected to a word line (WL). One end of a source/drain region is connected to a bit line (BL), while the other end of the source/drain region is connected to ground via a capacitor 12. The digital signal of the DRAM cell is stored in the capacitor 12. The storage capacity for the digital signal increases with an increase in the charge stored in the capacitor 12. Furthermore, if the charge is increased, signal read out from the memory, using amplification circuits during a read operation, will be less affected by noise.

Figure 3:
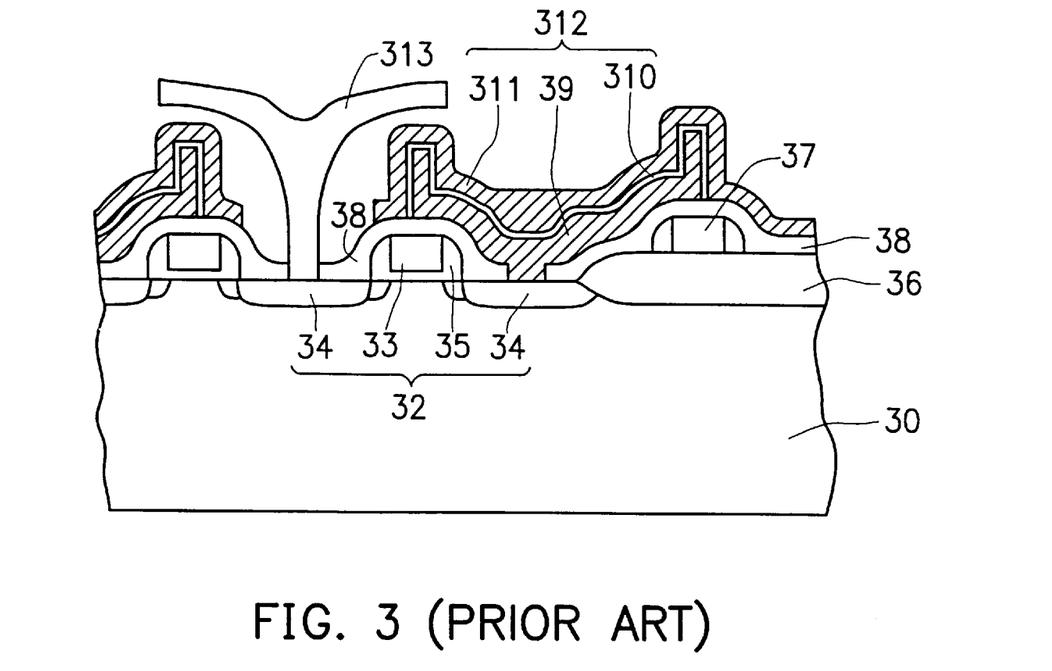
FIG. 3 is a cross-sectional view of a second conventional stacked DRAM capacitor.
Figure 4:
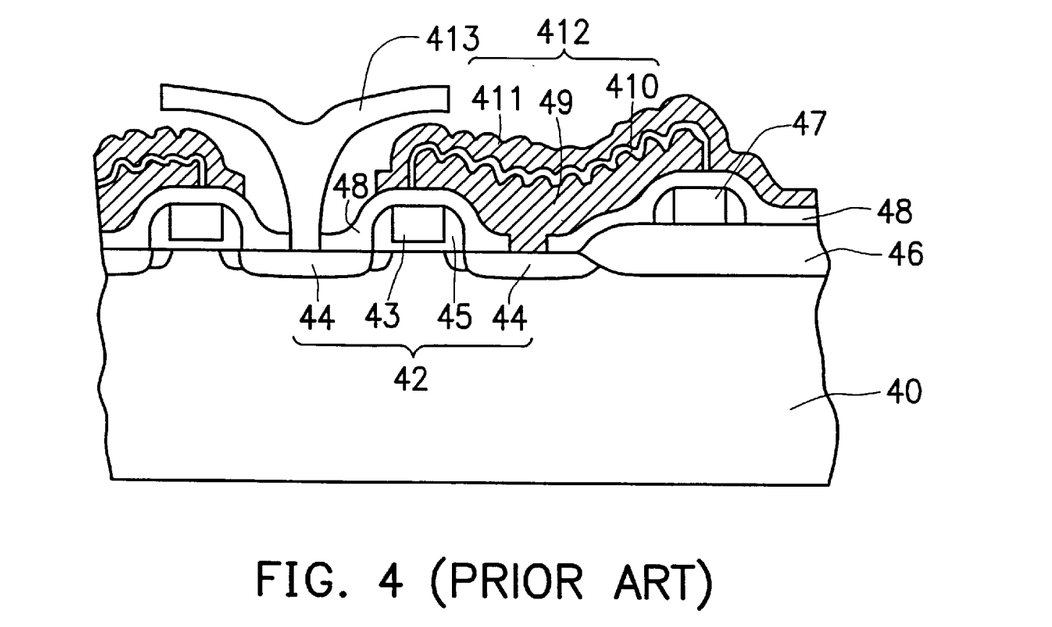
FIG. 4 is a cross-sectional view of a third conventional stacked DRAM capacitor.

There are several conventional methods of increasing the charge storage capacity of a capacitor. For example, by increasing the surface area of the conducting layer in the capacitor, or by reducing the thickness of the dielectric layer in the capacitor, the amount of charge capable of being stored in the capacitor can be increased. The stacked-type capacitor, as shown in FIGS. 2 through 4, is an example of a capacitor structure having an increased capacitor area.

Figure 2:
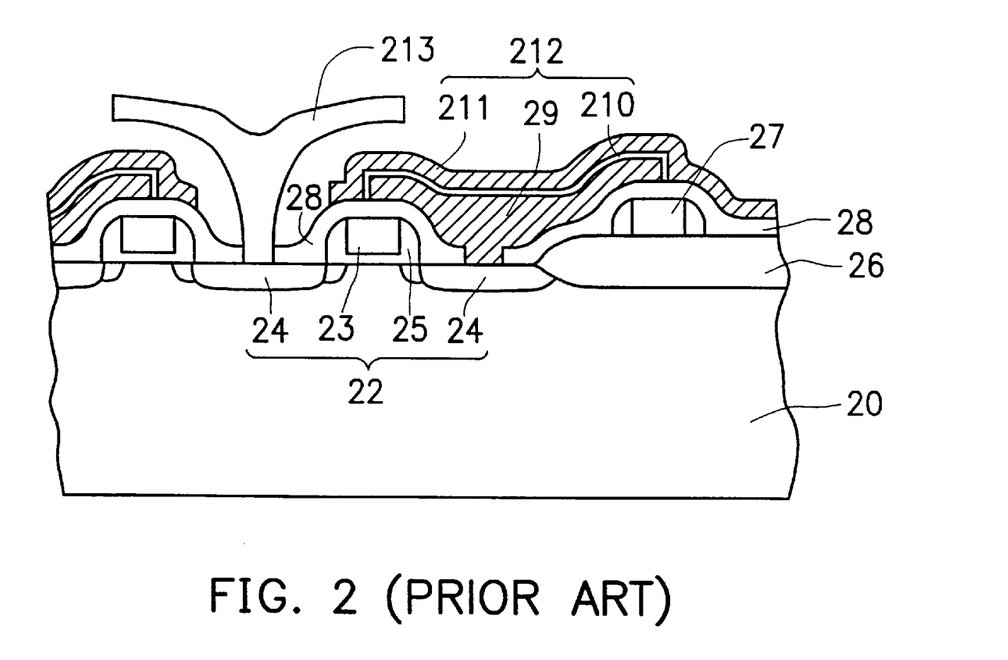
FIG. 2 is a cross-sectional view of a first conventional stacked DRAM capacitor.

FIG. 2 is a cross-sectional view of a conventional stacked DRAM capacitor. First, a semiconductor substrate 20 having a MOS transistor 22, a field oxide layer 26 and a conducting layer 27 formed thereabove, is provided. The MOS transistor 22 comprises a gate 23, source/drain regions 24 and spacers 25. Then, an insulating layer 28 is deposited. This is followed by etching the insulating layer 28 to form contact openings above designated source/drain regions 24. Thereafter, a lower electrode layer 29, a dielectric layer 210 and an upper electrode layer 211 are sequentially formed above the contact window. Lower electrode layer 29, dielectric layer 210 and upper electrode layer 211 form a stacked-type capacitor 212.

The dielectric layer 210 can be a silicon nitride/silicon oxide (NO) composite layer, or a silicon oxide/silicon nitridelsilicon oxide (ONO) composite layer. The lower electrode layer 29 and the upper electrode layer 211 can each be a polysilicon layer.

Finally, back-end processes, such as the formation of a metallic contact window 213 and the laying of a passivation layer (not shown in the figure), are performed to complete the fabrication of the DRAM structure.

FIG. 3 is a cross-sectional view of a second conventional stacked DRAM capacitor. First, a semiconductor substrate 30, having a MOS transistor 32, a field oxide layer 36 and a conducting layer 37 formed thereabove, is provided. The MOS transistor 32 is comprised of a gate 33, source/drain regions 34 and spacers 35. Then, an insulating layer 38 is deposited. This is followed by etching the insulating layer 38 to form contact openings above designated source/drain regions 34. Thereafter, a lower electrode layer 39, a dielectric layer 310 and an upper electrode layer 311 are sequentially formed above the contact window. Lower electrode layer 39, dielectric layer 310 and upper electrode layer 311 together form a stacked-type capacitor 312.

The dielectric layer 310 can be a silicon nitride/silicon oxide (NO) composite layer or a silicon oxide/silicon nitride/silicon oxide (ONO) composite layer. The lower electrode layer 39 and the upper electrode layer 311 can each be a polysilicon layer. Additionally, the lower electrode layer 39 has an irregular up-and-down surface profile.

Finally, back-end processes, such as the formation of a metallic contact window 313 and the laying of a passivation layer (not shown in the figure), are performed to complete the fabrication of the DRAM structure.

FIG. 4 is a cross-sectional view of a third conventional stacked DRAM capacitor. First, a semiconductor substrate 40, having a MOS transistor 42, a field oxide layer 46 and a conducting layer 47 formed thereabove, is provided. The MOS transistor 42 is comprised of a gate 43, source/drain regions 44 and spacers 45. Then, an insulating layer 48 is deposited. This is followed by etching the insulating layer 48 to form contact openings above designated source/drain regions 44. Thereafter, a lower electrode layer 49, a dielectric layer 410 and an upper electrode layer 411 are sequentially formed above the contact window. Lower electrode layer 49, dielectric layer 410 and upper electrode layer 411 together form a stacked-type capacitor 412.

The dielectric layer 410 can be a silicon nitride/silicon oxide (NO) composite layer or a silicon oxide/silicon nitride/silicon oxide (ONO) composite layer. The lower electrode layer 49 and the upper electrode layer 411 can each be a polysilicon layer. Additionally, the lower electrode layer 49 has an undulating surface profile to increase the surface area of the capacitor 412.

Finally, back-end processes, such as the formation of a metallic contact window 413 and the laying of a passivation layer (not shown in the figure), are performed to complete the fabrication of the DRAM structure.

The aforementioned stacked-type capacitor are currently the most common capacitor structures for DRAMs in use. These conventional methods all rely on improving the surface morphology of capacitors. Although the increase in surface area of the capacitor obtained by such methods increases its capacitance, the amount of such increase is limited, and is ineffective when applied to components having small dimensions.

SUMMARY OF THE INVENTION

It is therefore an object of this invention to provide a DRAM capacitor and a method of manufacturing the same which greatly increases the surface area of the capacitor, thus effectively raising the capacitor's capacitance.

It is yet another object of the present invention to provide a capacitor having an increased capacitance, which is suitable in applications requiring components having small dimensions.

To achieve the above objects, a DRAM capacitor and its method of manufacturing includes covering a semiconductor substrate with a first conducting layer. A first insulating layer and a second insulating layer are alternately stacked at least once above the first conducting layer to form a multi-layered structure. A contact window opening is formed in the multi-layered structure to expose a source/drain region located above the semiconductor substrate. A pattern is etch-defined on the multi-layered structure, using the first insulating layer as an etching stop layer. Part of the second insulating layer is etched away to form a cross-sectional profile similar to twin towers, with each tower having the form of a vertical T-stack. A second conducting layer covers the multi-layered structure. The first insulating layer and the second insulating layer of the multi-layered structure, as well as the second conducting layer in a top part of the multi-layered structure, are etched away to form a lower electrode. A dielectric layer is formed above the lower electrode. An upper electrode structure is formed above the dielectric layer.

BRIEF DESCRIPTION OF THE DRAWINGS

Other objects, features, and advantages of the invention will become apparent from the following detailed description of the preferred but non-limiting embodiments. The description is made with reference to the accompanying drawings, in which.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 5A:
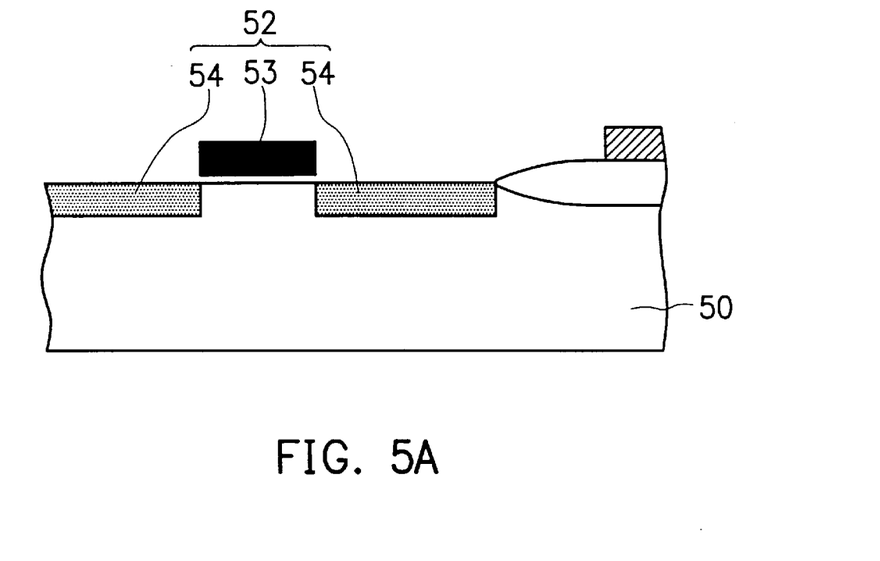
FIGS. 5A through 5G are a series of cross-sectional views showing the manufacturing steps of a stacked DRAM capacitor, according to a first embodiment of the present invention.

Referring to FIG. 5A, a semiconductor substrate 50 having a MOS transistor 52 is provided. MOS transistor 52 includes a gate 53 and source/drain regions 54.

Figure 5B:
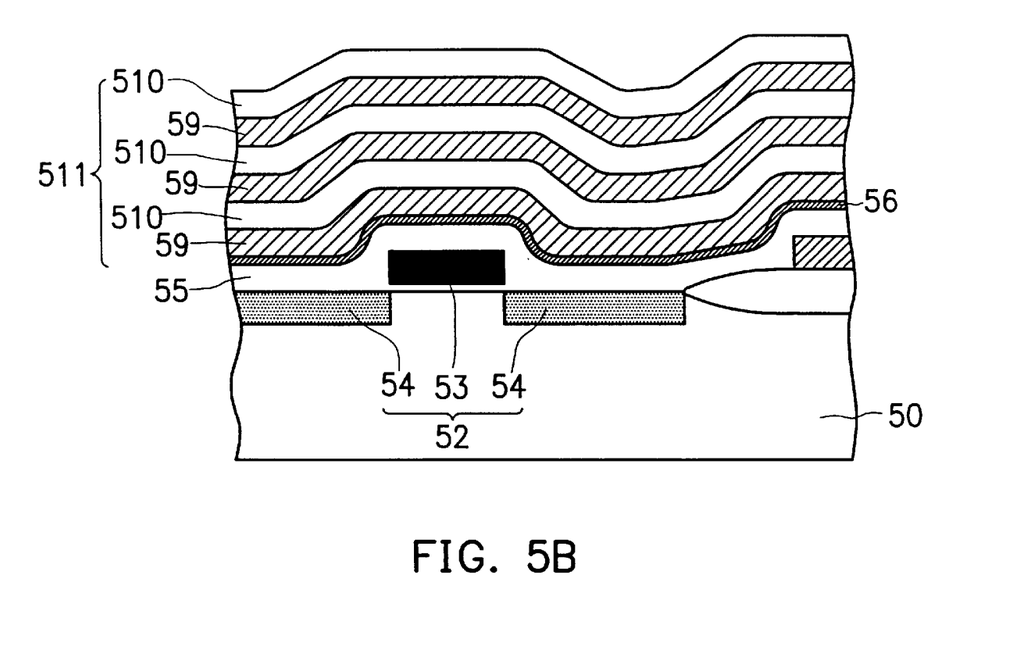

As shown in FIG. 5B, a first insulating layer 55 is deposited using chemical vapor deposition above the semiconductor substrate 50 using the reactive gas tetra-ethyl-ortho-silicate (TEOS). The first insulating layer 55 is preferably a borophosphosilicate glass (BPSG) layer having a thickness between about 3000 Å and about 6000 Å.

Then, a first conducting layer 56 is deposited above the first insulating layer 55. This is followed by alternately stacking (at least once) a second insulating layer 59 and a third insulating layer 510 above the first conducting layer 56 to form a multi-layered structure 511. The first conducting layer 56 is preferably a doped polysilicon layer having a thickness between about 500 Å and about 2000 Å. The second insulating layer 59 is preferably a silicon nitride layer having a thickness between about 2000 Å and about 5000 Å, and is deposited using chemical vapor deposition. The third insulating layer 510 is preferably a silicon dioxide layer with a thickness between about 2000 Å and about 5000 Å, and is deposited using chemical vapor deposition.

Figure 5C:
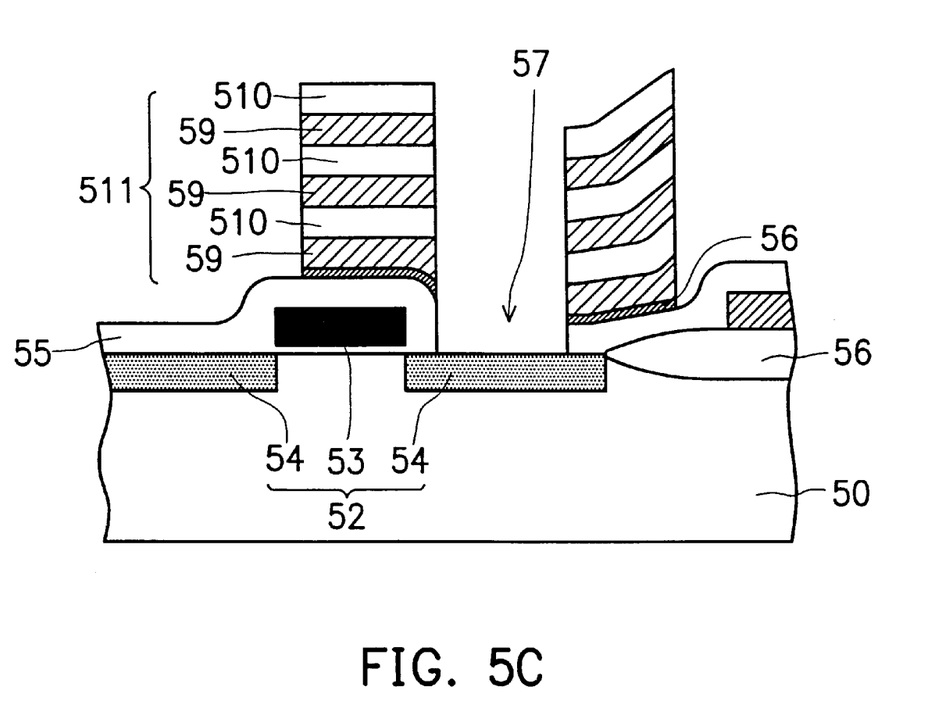

Referring next to FIG. 5C, anisotropic dry etching is used to etch the multi-layered structure 511 and form a centrally-located contact window opening 57 therein, and above the source/drain region 54. Opening 57 acts as a material receiving portion. Thereafter, the multi-layered structure 511 is etched and patterned, using the first insulating layer 55 as an etching stop layer, to form the multi-layered structure 511 as a hollow cylinder.

Figure 5D:
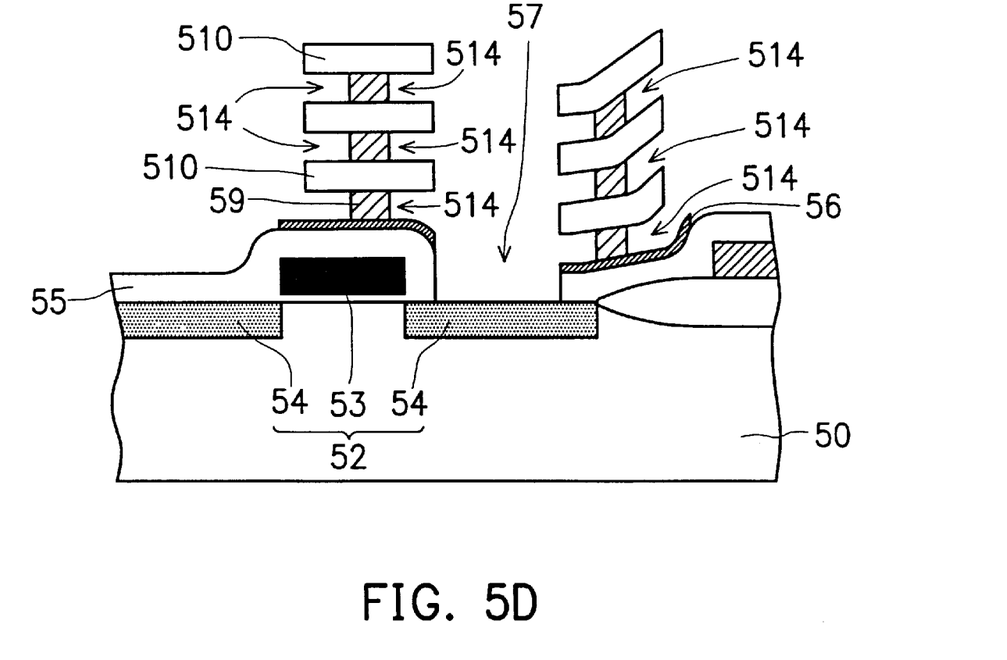

Referring to FIG. 5D, hot phosphoric acid (H$_3$PO$_4$) is used to wet etch and remove a portion of the second insulating layers 59, thus forming a plurality of trenches 514 on the sidewalls of the multi-layered structure 511. Trenches 514 each have depths which extend in the horizontal direction. This forms the multi-layered structure 511 with a cross-sectional profile similar to two twin towers. Each tower is in the form of a vertical stack of T's, which increases the exposed surface area of the multi-layered structure 511.

Figure 5E:
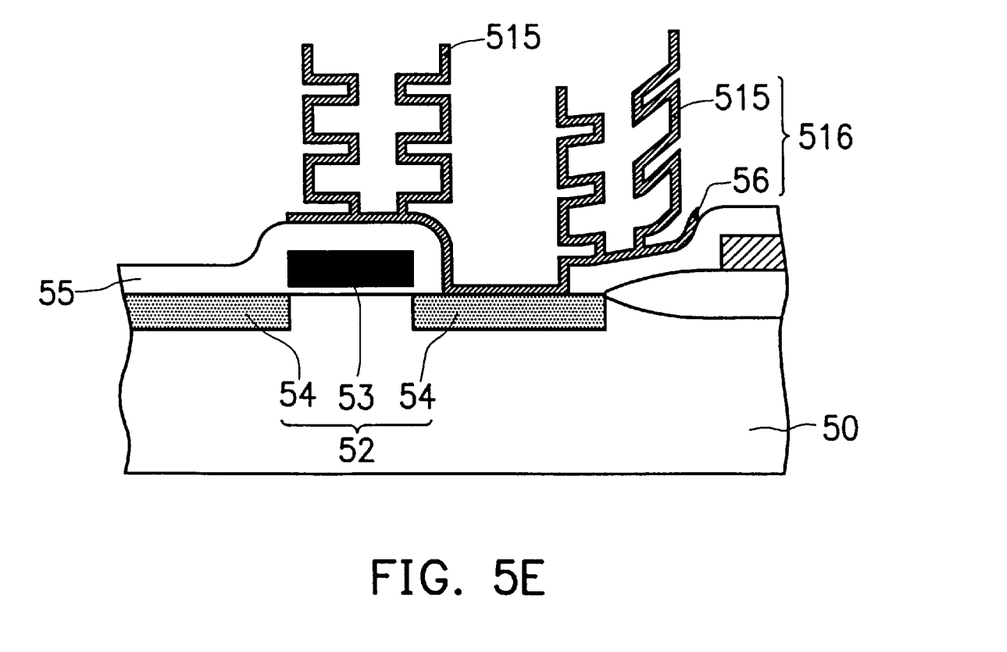

Referring next to FIG. 5E, a second conducting layer 515, for example, a doped polysilicon layer having a thickness between about 500 Å and about 2000 Å, is deposited over the surface of the second insulating layer 59, the third insulating layer 510 and the exposed surface of the semiconductor substrate 50. The polysilicon layer can be formed using chemical vapor deposition, and can be doped with ions to increase its electrical conductivity.

Next, a photoresist layer (not shown in the figure) is formed above the semiconductor substrate 50. This is followed by defining a pattern to expose the profile of the multi-layered structure 511.

Subsequently, the second conducting layer 515 at a top of the multi-layered structure 511 is etched away. Then, the second insulating layer 59 and the third insulating layer 510 are sequentially etched, leaving behind only the second conducting layer 515. The second conducting layer 515 has the form of a residual shell which originally clung to the external surface of the multi-layered structure 511. The second conducting layer 515 and the first conducting layer 56 together form a lower electrode 516.

Figure 5F:
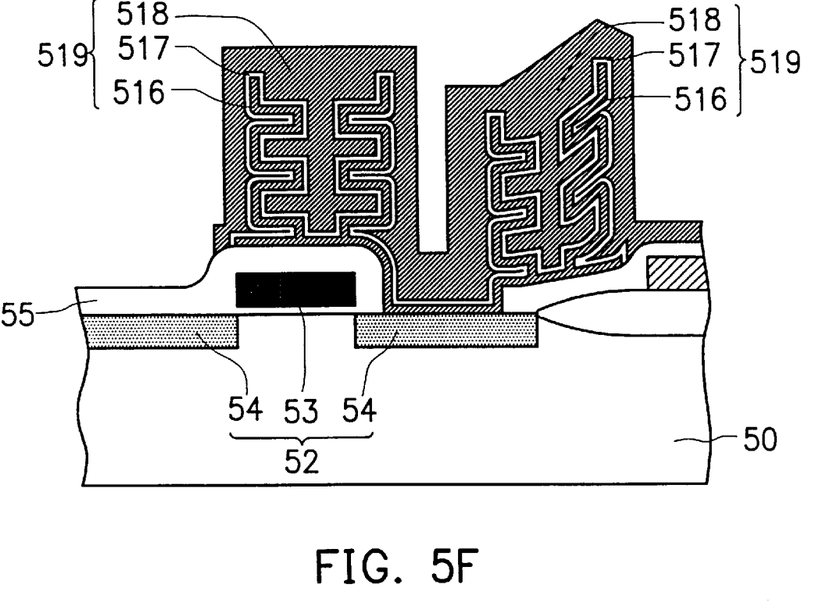

Referring to FIG. 5F, a dielectric layer 517, for example, a silicon oxide/silicon nitride\silicon oxide (ONO) composite layer, is deposited above the lower electrode 516. The ONO composite layer can be formed by first thermally growing a silicon oxide layer. Then, a silicon nitride layer is formed on top of the silicon oxide layer. Finally, a thermal oxidation process is performed to form another silicon oxide layer above the silicon nitride layer. The dielectric layer 517 typically has a thickness which is normally smaller than a thickness of the lower electrode 516. In general, the thickness of the dielectric layer 517 should not be greater than about 100 Å.

Next, an upper electrode 518, for example, a doped polysilicon layer having a thickness between about 1000 Å and about 3000 Å, is deposited above the dielectric layer 517. The upper electrode 518 is located over the lower electrode 516, and is electrically isolated from the lower electrode by the dielectric layer 517. The polysilicon layer can be formed using chemical vapor deposition, and can be doped with ions to increase its electrical conductivity.

Thereafter, the lower electrode 516, the dielectric layer 517 and the upper electrode 518 are etched to define the overall boundaries of the stacked DRAM capacitor 519.

Figure 5G:
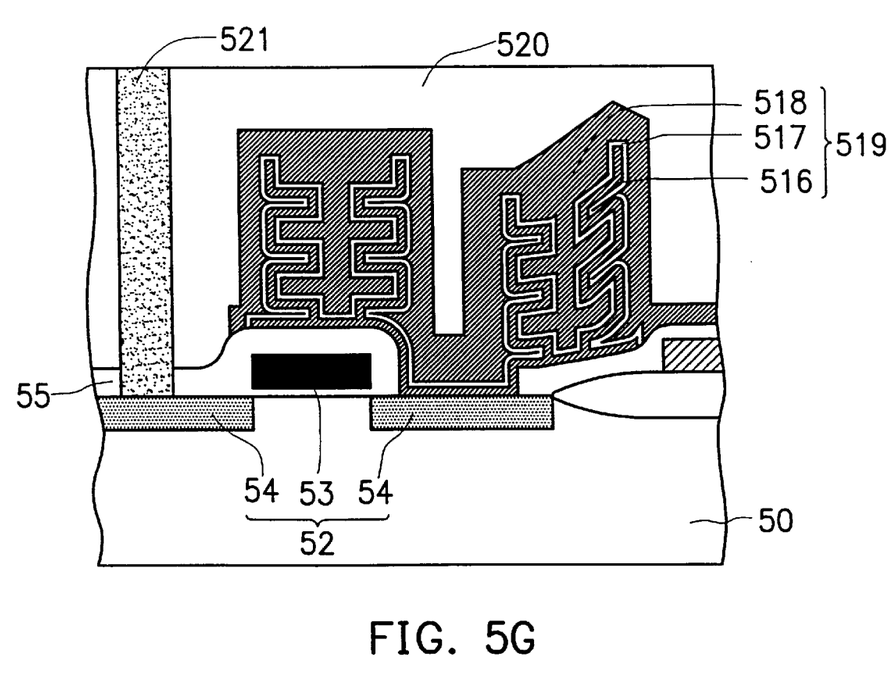

Referring to FIG. 5G, subsequent back end processes are performed, such as depositing a fourth insulating layer 520 for planarization. This can be followed by the formation of a metal interconnect 521, so as to complete the DRAM structure according to this invention.

FIGS. 6A through 6G are a series of cross-sectional views showing the manufacturing steps of a DRAM capacitor, according to a second preferred embodiment of the present invention. This capacitor is a combination trench-type and stacked-type capacitor.

Figure 6A:
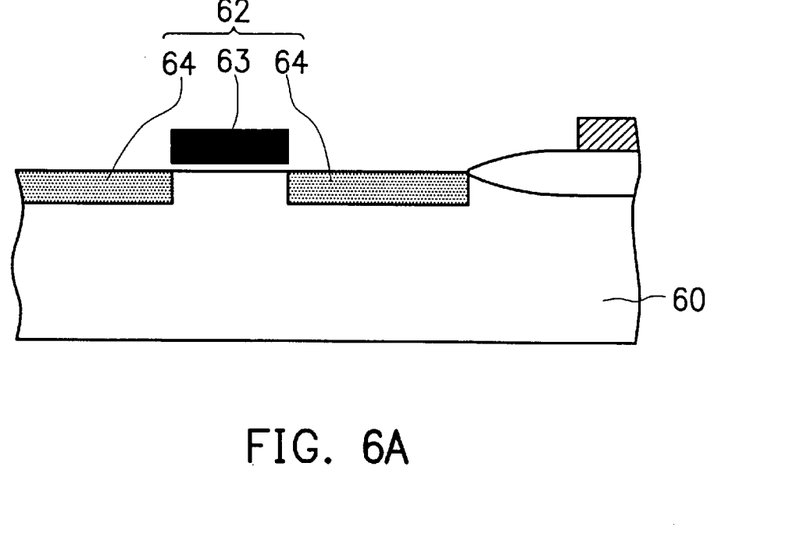
FIGS. 6A through 6G are a series of cross-sectional views showing the manufacturing steps of a DRAM capacitor according to a second embodiment of the present invention.

Referring to FIG. 6A, a semiconductor substrate 60 having a MOS transistor 62 is provided. MOS transistor 62 includes a gate 63 and source/drain regions 64.

Figure 6B:
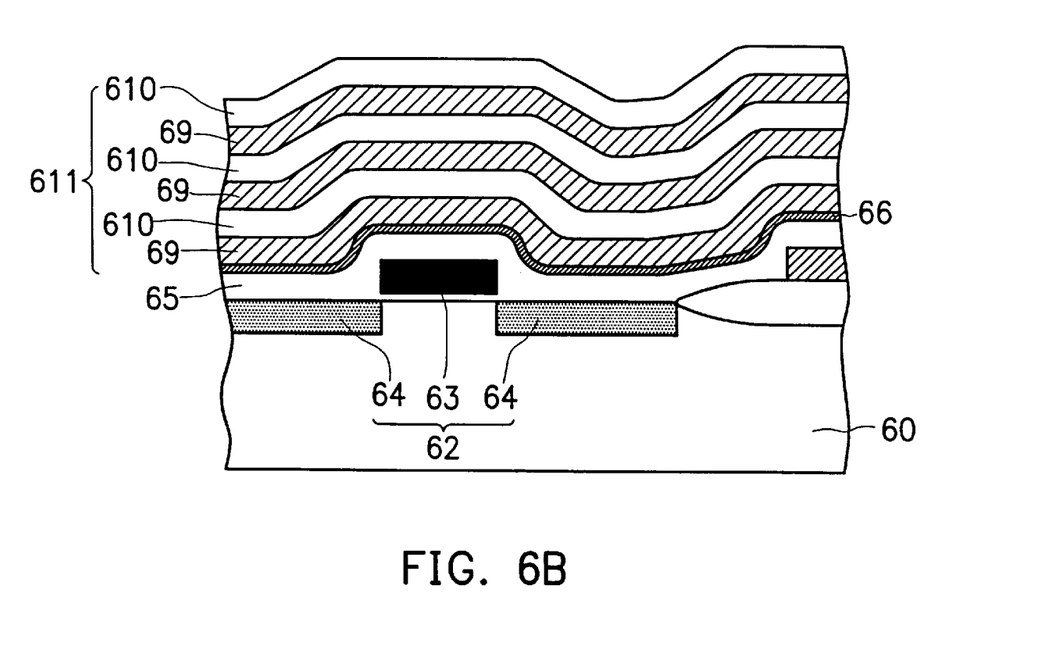

As shown in FIG. 6B, a first insulating layer 65 is deposited above the semiconductor substrate 60 using the reactive gas tetra-ethyl-ortho-silicate (TEOS). The first insulating layer 65 is preferably a borophosphosilicate glass (BPSG) layer having a thickness between about 3000 Å and about 6000 Å.

Then, a first conducting layer 66 is deposited above the first insulating layer 65. This is followed by alternately stacking (at least once) a second insulating layer 69 and a third insulating layer 610 above the first conducting layer 66 to form a multi-layered structure 611. The first conducting layer 66 is preferably a doped polysilicon layer having a thickness between about 500 Å and about 2000 Å. The second insulating layer 69 is preferably a nitride layer having a thickness between about 2000 Å and about 5000 Å. The third insulating layer 610 is preferably a silicon dioxide layer with a thickness between about 2000 Å and about 5000 Å.

Figure 6C:
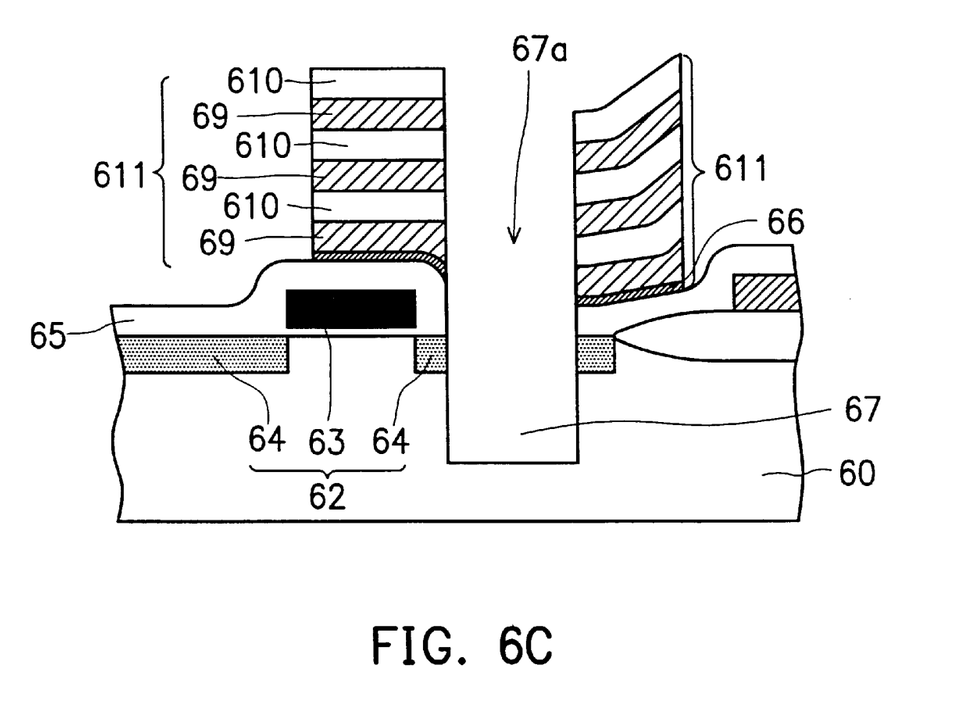

Referring next to FIG. 6C, anisotropic dry etching is used to etch the multi-layered structure 511 and form a centrally-located contact window opening 67a therein, and above the source/drain region 64. Opening 67a acts as a material receiving portion. Then, the etching is continued in a downward direction through the source/drain region 64 to form a first trench 67.

Thereafter, the multi-layered structure 611 is etched and patterned, using the first insulating layer 65 as an etching stop layer, to form the multi-layered structure 611 as a hollow cylinder.

Figure 6D:
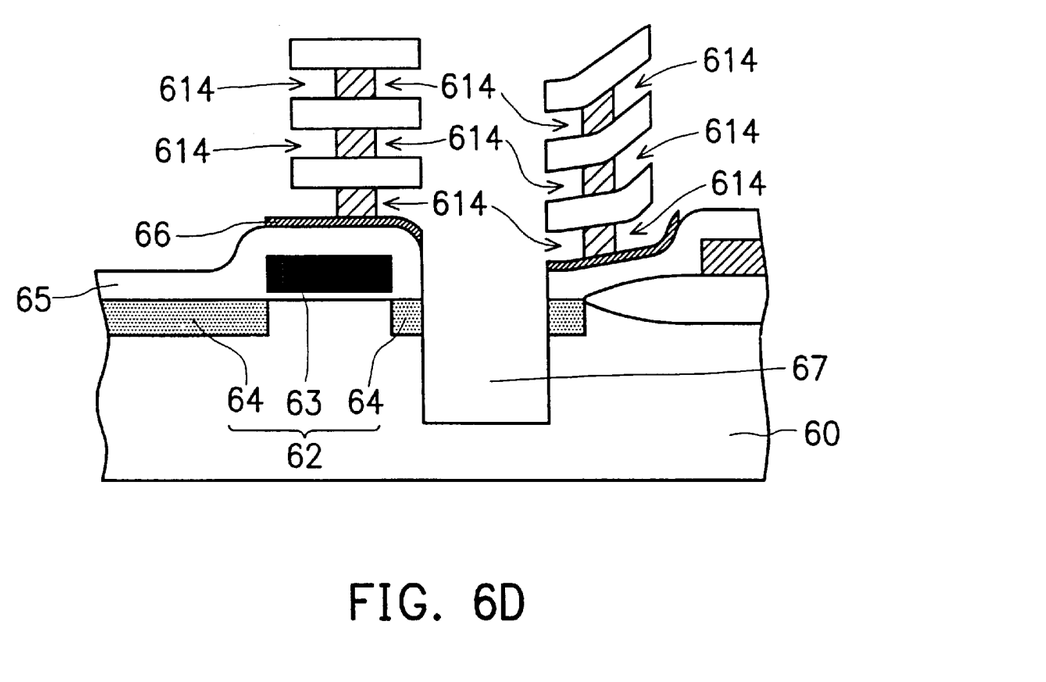

Referring to FIG. 6D, hot phosphoric acid ($H_3PO_4$) is used to wet etch and remove a portion of the second insulating layers 69, thus forming a plurality of trenches 614 on the sidewalls of the multi-layered structure 611. Trenches 614 each have depths which extend in the horizontal direction. This forms the multi-layered structure 611 with a cross-sectional profile similar to two twin towers. Each tower is in the form of a vertical stack of T's, which increases the exposed surface area of the multi-layered structure 611.

Figure 6E:
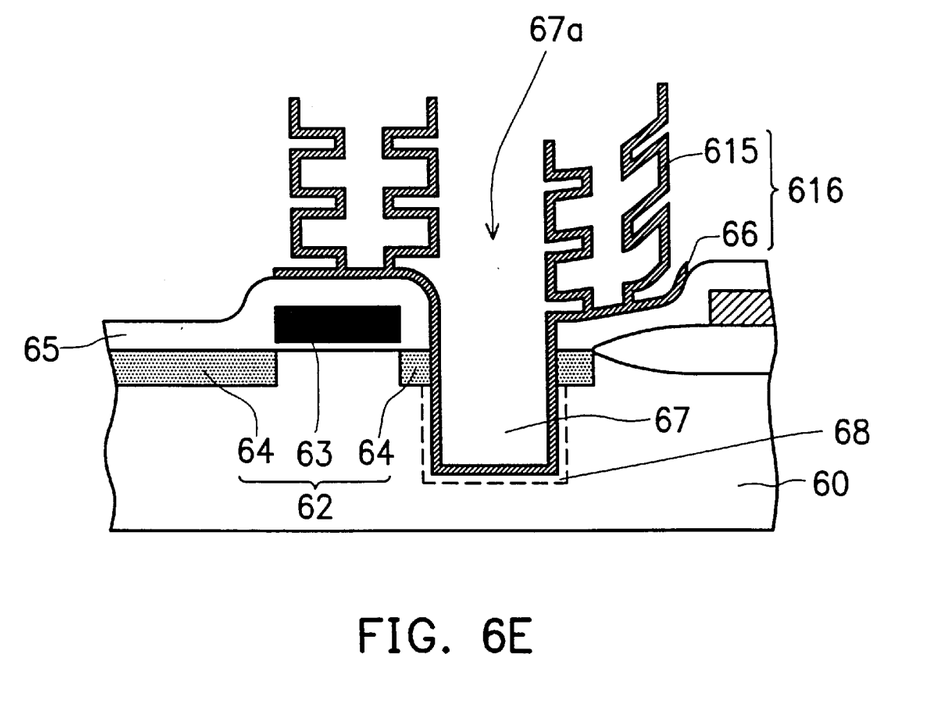

Referring next to FIG. 6E, a second conducting layer 615, for example, a doped polysilicon layer having a thickness between about 500 Å and about 2000 Å, is deposited over the surface of the second insulating layer 69, the third insulating layer 610 and the exposed surface of the semiconductor substrate 60. The polysilicon layer can be formed using chemical vapor deposition, and can be doped with ions to increase its electrical conductivity.

Next, a photoresist layer (not shown in the figure) is formed above the semiconductor substrate 60. This is followed by defining a pattern to expose the profile of the multi-layered structure 611.

Subsequently, the second conducting layer 615 at a top of the multi-layered structure 611 is etched away. Then, the second insulating layer 69 and the third insulating layer 610 are sequentially etched, leaving behind only the second conducting layer 615. The second conducting layer 615 has the form of a residual shell which originally clung to the external surface of the multi-layered structure 611.

Thereafter, an annealing operation is performed to activate the doped ions inside the second conducting layer 615 of the trench 67. This forms a diffusion region 68 at the bottom of the trench 67, which is the area enclosed by the dashed line in FIG. 6E. The diffusion region 68 acts as a bridge, electrically linking the electrically separated source/drain region 64, which was divided by the rift caused by the formation of the trench 67.

The second conducting layer 615 and the first conducting layer 66 together form a lower electrode 616.

Figure 6F:
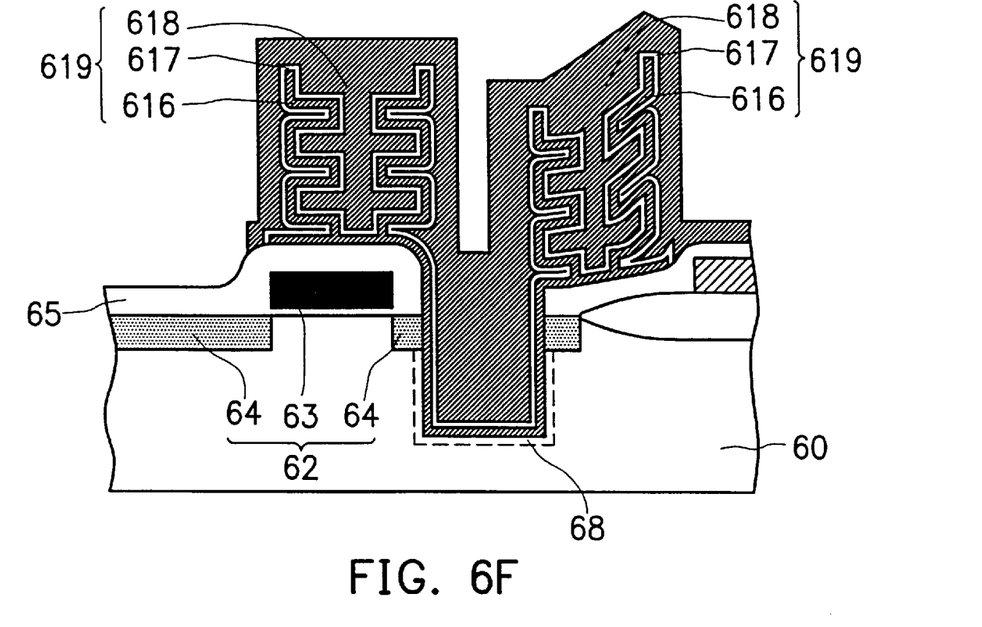

Referring to FIG. 6F, a dielectric layer 617, for example, a silicon oxide/silicon nitride/silicon oxide (ONO) composite layer, is deposited above the lower electrode 616. The ONO composite layer can be formed by first thermally growing a silicon oxide layer. Then, a silicon nitride layer is formed on top of the silicon oxide layer. Finally, a thermal oxidation process is performed to form another silicon oxide layer above the silicon nitride layer. The dielectric layer 617 typically has a thickness which is normally smaller than a thickness of the lower electrode 616. In general, the thickness of the dielectric layer 617 should not be greater than about 100 Å.

Next, an upper electrode 618, for example, a doped polysilicon layer having a thickness between about 1000 Å and about 3000 Å, is deposited above the dielectric layer 617. The polysilicon layer can be formed using chemical vapor deposition, and can be doped with ions to increase its electrical conductivity.

Thereafter, the lower electrode 616, the dielectric layer 617 and the upper electrode 618 are etched to define the overall boundaries of the stacked DRAM capacitor 619.

Figure 6G:
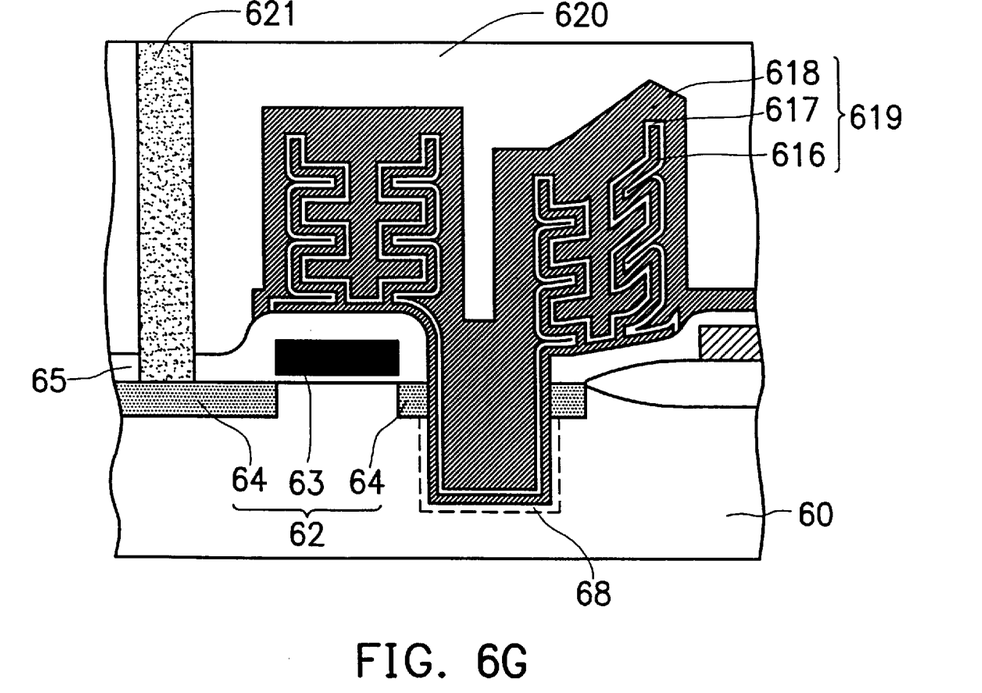

Referring to FIG. 6G, subsequent back end processes are performed, such as depositing a fourth insulating layer 620 for planarization. This can be followed by the formation of a metal interconnect 621, so as to complete the DRAM structure according to this invention.

In summary, the manufacturing method according to the present invention has the following advantages:

(1) The multi-layered structure formed by repeatedly and alternately depositing a first conducting layer and a second insulating layer can greatly increase the surface area of the capacitor, thus greatly increasing the amount of charge capable of being stored in the capacitor.

(2) The manufacturing method has fewer steps than other conventional methods of making capacitor structures. Therefore, both production cost and production time are lower.

(3) Trench-type and stacked-type capacitor configurations can be used together in the same capacitor. This flexibility allows for a tremendous increase in the surface area of the capacitor, and hence its charge storage capacity.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a stacked DRAM capacitor, comprising:

providing a semiconductor substrate with a MOS transistor formed thereabove, the MOS transistor including a gate and source/drain regions;

covering the semiconductor substrate with a first insulating layer;

forming a first conducting layer over the first insulating layer;

forming a multi-layered structure over the first conducting layer by alternately stacking, at least once, a second insulating layer and a third insulating layer;

etching the multi-layered structure to form a contact window opening therein and above the source/drain regions;

etching and defining a pattern on the multi-layered structure using the first insulating layer as an etching stop layer;

etching the second insulating layer to remove a portion thereof, so that only a portion of the second insulating layer remains, thereby forming a plurality of trenches having depths which extend in a horizontal direction into respective sidewalls of the multi-layered structure, and creating a tower structure with a cross-sectional profile of a tower having a profile of a plurality of T's stacked on top of one another in a vertical direction;

forming a second conducting layer over a exposed surface of the second insulating layer, the third insulating layer and the first conducting layer, wherein the first conducting layer and the second conducting layer together form a lower electrode;

removing the second conducting layer at a top of the tower structure;

sequentially etching away the second insulating layer and the third insulating layer of the tower structure to form a hollow portion in an interior of the tower structure;

forming a dielectric layer above the lower electrode; and forming an upper electrode above the dielectric layer.

2. The method according to claim 1, wherein said covering the semiconductor substrate includes forming the first insulating layer using chemical vapor deposition.

3. The method according to claim 1, wherein said covering the semiconductor substrate includes covering the semiconductor substrate with a borophosphosilicate glass insulating layer.

4. The method according to claim 1, wherein said forming a first conducting layer includes comprising the first conducting layer of a doped polysilicon layer.

5. The method according to claim 1, wherein said forming a first conducting layer includes forming the first conducting layer to a thickness between about 500 Å and 2000 Å.

6. The method according to claim 1, wherein said forming a multi-layered structure includes using chemical vapor deposition to form the second insulating layer.

7. The method according to claim 1, wherein said forming a multi-layered structure includes comprising the second insulating layer of silicon nitride.

8. The method according to claim 1, wherein said forming a multi-layered structure includes forming the second insulating layer to a thickness between about 2000 Å and 5000 Å.

9. The method according to claim 1, wherein said forming a multi-layered structure includes using chemical vapor deposition to form the third insulating layer.

10. The method according to claim 1, wherein said forming a multi-layered structure includes comprising the third insulating layer of an silicon oxide.

11. The method according to claim 1, wherein said forming a multi-layered structure includes forming the third insulating layer to a thickness between about 2000 Å and 5000 Å.

12. The method according to claim 1, wherein said etching the multi-layered structure includes forming the contact window opening using dry etching.

13. The method according to claim 1, wherein said etching the second insulating layer includes wet etching using hot phosphoric acid as an etchant solution to form the trenches.

14. The method according to claim 1, wherein said forming a second conducting layer includes using chemical vapor deposition, with the second conducting layer being doped with ions to increase its electrical conductivity.

15. The method according to claim 1, wherein said forming a dielectric layer includes:

thermally growing a first silicon oxide layer;

forming a silicon nitride layer on top of the first silicon oxide layer; and performing a thermal oxidation process to form a second silicon oxide layer above the silicon nitride layer, thereby forming a silicon oxide/silicon nitride/silicon oxide composite dielectric layer.

16. The method according to claim 1, wherein said forming an upper electrode includes using chemical vapor deposition, with the upper electrode being doped with ions to increase its electrical conductivity.

17. The method according to claim 1, further comprising etching the lower electrode, the dielectric layer and the upper electrode to form a pattern.

18. The method according to claim 1, wherein said etching the multi-layered structure includes etching the source/drain regions to form a trench region, with the lower electrode, the dielectric layer and the upper electrode all extending into the trench region.

19. The method according to claim 18, wherein the second conducting layer is doped with ions, and wherein the trench region divides the source/drain regions into two portions; further comprising annealing the trench region, after said forming a second conducting layer, to activate the ions therein and form a diffusion region at a bottom of the trench region, the diffusion region electrically connecting the two portions of the source/drain regions together.

* * * * *